US005411845A

United States Patent [19]

Robinson

[11] Patent Number: 5,411,845

[45] Date of Patent: May 2, 1995

[54] POLYMERIC FILM COATED WITH A SUBBING LAYER CONTAINING CROSS-LINKING AGENT AND (N-SUBSTITUTED) MONOALLYLAMINE POLYMER

[75] Inventor: Julian N. Robinson, Maltby, England

[73] Assignee: Imperial Chemical Industries PLC, London, England

[21] Appl. No.: 283,909

[22] Filed: Aug. 4, 1994

Related U.S. Application Data

[63] Continuation of Ser. No. 18,500, Feb. 17, 1993, abandoned.

[30] Foreign Application Priority Data

Feb. 17, 1992 [GB] United Kingdom ................. 9203350

[51] Int. Cl.$^6$ ................................................ G03F 7/09

[52] U.S. Cl. .................................... 430/531; 430/523; 430/536; 430/537; 428/474.4; 428/483

[58] Field of Search ............... 420/271, 523, 531, 536, 420/537; 428/474.4, 483

[56] References Cited

U.S. PATENT DOCUMENTS

| | | | |
|---|---|---|---|
| 2,448,525 | 9/1948 | Glick . | |
| 2,675,316 | 4/1951 | Carroll et al. | 430/537 |
| 2,882,156 | 4/1959 | Minsk | 430/537 |
| 3,399,995 | 9/1968 | Winchell | 430/537 |
| 3,708,289 | 1/1973 | Timmerman et al. | 430/528 |
| 4,145,220 | 3/1979 | Timmerman et al. | 430/537 |
| 4,312,940 | 1/1982 | Nakamura et al. | 430/537 |
| 4,330,618 | 5/1982 | Minamizono et al. | 430/537 |
| 4,374,924 | 2/1983 | Yokoyama et al. | 430/528 |
| 4,379,838 | 4/1983 | Helling et al. | 430/537 |
| 4,504,569 | 3/1985 | Abel et al. | 430/537 |
| 4,513,080 | 4/1985 | Helling | 430/537 |
| 4,590,151 | 5/1986 | Arter et al. | 430/537 |
| 4,614,681 | 9/1986 | Hayashi et al. | 430/537 |
| 4,623,614 | 11/1986 | Yoneyama et al. | 430/537 |
| 4,810,624 | 3/1989 | Hardam et al. | 430/528 |
| 4,914,018 | 4/1990 | Besio et al. | 430/528 |
| 5,019,494 | 5/1991 | Toya et al. | 430/537 |
| 5,137,802 | 8/1992 | Ueda et al. | 430/527 |

FOREIGN PATENT DOCUMENTS

| | | |
|---|---|---|
| 0321948 | 6/1989 | European Pat. Off. . |
| 0360926 | 4/1990 | European Pat. Off. . |
| 57-73735 | 5/1982 | Japan . |
| 62-174184 | 7/1987 | Japan . |
| 2-280506 | 8/1990 | Japan . |
| 537232 | 6/1941 | United Kingdom . |

*Primary Examiner*—Charles L. Bowers, Jr.
*Assistant Examiner*—Christopher G. Young
*Attorney, Agent, or Firm*—Cushman Darby & Cushman

[57] ABSTRACT

A coated film having a polymeric film substrate with a subbing layer containing greater than 30% by weight of a polymer which has greater than 60 mole % of a repeating unit(s) containing a pendant nitrogen atom(s). The coated film exhibits excellent adhesion to photographic emulsion layers.

8 Claims, 1 Drawing Sheet

POLYMERIC FILM COATED WITH A SUBBING LAYER CONTAINING CROSS-LINKING AGENT AND (N-SUBSTITUTED) MONOALLYLAMINE POLYMER

This is a continuation of application Ser. No. 08/018,500, filed on Feb. 17, 1993, which was abandoned upon the filing hereof.

This invention relates to a coated polymeric film, and in particular to a coated polymeric film suitable for coating with a light-sensitive photographic emulsion, to a light-sensitive photographic film and to processes for the production of the coated polymeric film.

It is known in the photographic art that light-sensitive photographic emulsions, such as conventional light-sensitive gelatinous silver halide emulsions, do not adhere readily to the surfaces of thermoplastic film substrates, such as films of synthetic linear polyesters. It is common practice in the art to improve the adhesion between the film substrate and the photographic emulsion by pretreating the surface of the substrate prior to the application of the photographic emulsion, for example, by coating with one or more polymeric adhesion-promoting layers and optionally with a further adhesion-promoting gelatinous layer. The aforementioned layers are often known in the art as subbing layers. Examples of such subbing layers are described in British Patent Nos. 1540067, 1583343 and 1583547. Unfortunately, prior art subbing layers do not provide a solution to all the commercial requirements of photographic films. Known subbing layers significantly improve the adhesion of some light-sensitive layers to the film substrate, but are less effective with other light-sensitive layers, such as emulsion layers used in graphic arts film. There is a need for subbing layers exhibiting improved adhesion to a wide range of light-sensitve emulsions, for example with the many different types of commercially available gelatin materials routinely employed in light-sensitive emulsions. Prior art subbing layers also tend to be less effective in relatively wet than in relatively dry conditions. There is a commercial requirement for improving the effectiveness of subbing layers under so-called "wet" conditions.

Commercially available photographic films generally have more than one subbing or intermediate layer between the substrate and a light-sensitive layer. An improvement in the efficiency of the process of producing a photographic film would be achieved if a single subbing layer could be used.

Subbing layers are traditionally applied to the film substrate after the production of the film has been completed, ie "off-line", which results in an increase in the number of process steps required to produce the coated film. There is a need to be able to apply the subbing layer during the film making process, ie "in-line", in order to simplify and improve the efficiency of the production process.

We have now devised an improved coated polymeric film and an improved light-sensitive photographic film which reduces or substantially overcomes at least one of the aforementioned problems.

Accordingly, the present invention provides a coated film comprising a polymeric film substrate having on at least one surface thereof a subbing layer comprising greater than 30% by weight of a polymer comprising greater than 60 mole % of at least one or more repeating units comprising at least one or more pendant nitrogen atoms.

The invention also provides a method of producing a coated film by forming a substrate layer of polymeric material, and applying, to at least one surface of the substrate, a subbing layer comprising greater than 30% by weight of a polymer comprising greater than 60 mole % of at least one or more repeating units comprising at least one or more pendant nitrogen atoms.

The invention further provides a light sensitive photographic film which comprises a light-sensitive photographic emulsion layer applied directly or indirectly on the subbing layer of a coated film as described herein.

A substrate for use in the production of a coated film according to the invention suitably comprises any polymeric material capable of forming a self-supporting opaque, or transparent, film or sheet.

By a "self-supporting film or sheet" is meant a film or sheet capable of independent existence in the absence of a supporting base.

The substrate of a coated film according to the invention may be formed from any synthetic, film-forming, polymeric material. Suitable thermoplastics, synthetic, materials include a homopolymer or a copolymer of a 1-olefine, such as ethylene, propylene or butene-1, especially polypropylene, a polyamide, a polycarbonate, and particularly a synthetic linear polyester which may be obtained by condensing one or more dicarboxylic acids or their lower alkyl (up to 6 carbon atoms) diesters, eg terephthalic acid, isophthalic acid, phthalic acid, 2,5-, 2,6- or 2,7-naphthalenedicarboxylic acid, succinic acid, sebacic acid, adipic acid, azelaic acid, 4,4′- diphenyldicarboxylic acid, hexahydro-terephthalic acid or 1,2-bis-p-carboxyphenoxyethane (optionally with a monocarboxylic acid, such as pivalic acid) with one or more glycols, particularly an aliphatic glycol, eg ethylene glycol, 1,3-propanediol, 1,4-butanediol, neopentyl glycol and 1,4-cyclohexanedimethanol. A polyethylene terephthalate film is particularly preferred, especially such a film which has been biaxially oriented by sequential stretching in two mutually perpendicular directions, typically at a temperature in the range 70° to 125° C., and preferably heat set, typically at a temperature in the range 150° to 250° C., for example—as described in British patent 838,708.

The substrate may also comprise a polyarylether or thio analogue thereof, particularly a polyaryletherketone, polyarylethersulphone, polyaryletheretherketone, polyaryletherethersulphone, or a copolymer or thioanalogue thereof. Examples of these polymers are disclosed in EP-A-1879, EP-A-184458 and U.S. Pat. No. 4,008,203. The substrate may comprise a poly(arylene sulphide), particularly poly-p-phenylene sulphide or copolymers thereof. Blends of the aforementioned polymers may also be employed.

Suitable thermoset resin substrate materials include addition—polymerisation resins—such as acrylics, vinyls, bis-maleimides and unsaturated polyesters, formaldehyde condensate resins—such as condensates with urea, melamine or phenols, cyanate resins, functionalised polyesters, polyamides or polyimides.

The polymeric film substrate for production of a coated film according to the invention may be unoriented, or uniaxially oriented, but is preferably biaxially oriented by drawing in two mutually perpendicular directions in the plane of the film to achieve a satisfactory combination of mechanical and physical properties. Simultaneous biaxial orientation may be effected by extruding a thermoplastics polymeric tube which is subsequently quenched, reheated and then expanded by internal gas pressure to induce transverse orientation, and withdrawn at a rate which will induce longitudinal orientation. Sequential stretching may be effected in a stenter process by extruding the thermoplastics substrate material as a flat extrudate which is subsequently stretched first in one direction and then in the other mutually perpendicular direction. Generally, it is preferred to stretch firstly in the longitudinal direction, ie the forward direction through the film stretching machine, and then in the transverse direction. A stretched substrate film may be, and preferably is, dimensionally stabilised by heat-setting under dimensional restraint at a temperature above the glass transition temperature thereof.

The substrate is suitably of a thickness from 6 to 300, particularly from 10 to 200, and especially from 100 to 175 μm.

An opaque substrate, for use in the production of a coated film according to the present invention, preferably has a Transmission Optical Density (Sakura Densitometer; type PDA 65; transmission mode) of from 0.75 to 1.75, and particularly of from 1.20 to 1.50. The substrate is conveniently rendered opaque by incorporation into the synthetic polymer of an effective amount of an opacifying agent. However, in a preferred embodiment of the invention the opaque substrate is voided, by which is meant that the substrate comprises a cellular structure containing at least a proportion of discrete, closed cells. It is therefore preferred to incorporate into the substrate polymer an effective amount of an agent which is capable of generating an opaque, voided structure. Suitable voiding agents, which also confer opacity, include an organic filler, a particulate inorganic filler or a mixture of two or more such fillers.

Particulate inorganic fillers suitable for generating an opaque, voided substrate include conventional inorganic pigments and fillers, and particularly metal or metalloid oxides, such as alumina, silica and titania, and alkaline metal salts, such as the carbonates and sulphates of calcium and barium. Barium sulphate is a particularly preferred filler which also functions as a voiding agent.

Non-voiding particulate inorganic fillers may also be added to the substrate.

Suitable voiding and/or non-voiding fillers may be homogeneous and consist essentially of a single filler material or compound, such as titanium dioxide or barium sulphate alone. Alternatively, at least a proportion of the filler may be heterogeneous, the primary filler material being associated with an additional modifying component. For example, the primary filler particle may be treated with a surface modifier, such as a pigment, soap, surfactant coupling agent or other modifier to promote or alter the degree to which the filler is compatible with the substrate polymer.

Production of a substrate having satisfactory degrees of opacity, voiding and whiteness requires that the filler should be finely-divided, and the average particle size thereof is desirably from 0.1 to 10 μm provided that the actual particle size of 99.9% by number of the particles does not exceed 30 μm. Preferably, the filler has an average particle size of from 0.1 to 10 μm, and particularly preferably from 0.2 to 0.75 μm. Decreasing the particle size improves the gloss of the substrate.

Particle sizes may be measured by electron microscope, coulter counter or sedimentation analysis and the average particle size may be determined by plotting a cumulative distribution curve representing the percentage of particles below chosen particle sizes.

It is preferred that none of the filler particles incorporated into the opaque substrate layer according to this invention should have an actual particle size exceeding 30 μm. Particles exceeding such a size may be removed by sieving processes which are known in the art. However, sieving operations are not always totally successful in eliminating all particles greater than a chosen size. In practice, therefore, the size of 99.9% by number of the particles should not exceed 30 μm. Most preferably the size of 99.9% of the particles should not exceed 20 μm.

Incorporation of the opacifying/voiding agent into the substrate polymer may be effected by conventional techniques—for example, by mixing with the monomeric reactants from which the polymer is derived, or by dry blending with the polymer in granular or chip form prior to formation of a film therefrom.

The amount of filler, particularly of barium sulphate, incorporated into the substrate polymer desirably should be not less than 5% nor exceed 50% by weight, based on the weight of the polymer. Particularly satisfactory levels of opacity and gloss are achieved when the concentration of filler is from about 8 to 30%, and especially from 15 to 20%, by weight, based on the weight of the substrate polymer.

By a pendant nitrogen atom(s) of a repeating unit(s) of the subbing layer polymer is meant a nitrogen atom which is not part of the backbone chain of the polymer, ie the nitrogen atom is present in a side chain attached to the backbone chain of the polymer. In one embodiment of the invention, at least one or more nitrogen atoms may optionally be present in the polymer backbone, but in addition to the pendant nitrogen atom of the repeating unit.

The at least one or more repeating units of the subbing layer polymer preferably have the general structure

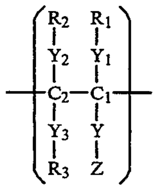

wherein

Z represents amine, amide, quaternary ammonium, and/or salts thereof, $R_1$, $R_2$ and $R_3$ are the same or different and represent hydrogen, halogen, alkyl, nitrile, amine, amide, quaternary ammonium, ketone, ether, vinyl, and/or salts thereof, and Y, $Y_1$, $Y_2$ and $Y_3$ are optional intermediaries, which may be the same or different.

The optional intermediary Y represents one or more atoms providing a linking chain of atom(s) between Z and carbon atom $C_1$. The linking chain may be a direct or an indirect link and will normally comprise one or more carbon atoms (which could, for example, include carbon atoms in an aryl ring) and/or hetero atoms (particularly nitrogen and/or oxygen atoms). Y is preferably a direct link, more preferably an alkylene group, optionally substituted, having up to 10, particularly up to 6 and especially 1 or 2 carbon atoms. In the most preferred embodiment of the invention Y is $(CH_2)$.

Z preferably represents an amine, more preferably a tertiary, particularly a secondary and especially a primary amine and/or a salt thereof. In a preferred embodiment of the invention Z is in a salt form, ie Z is protonated and associated with a suitable negatively charged counter ion, such as a halide, eg chloride, sulphate, sulphite, phosphate, carboxylate or sulphonate anion. The counter ion is preferably an organic species, more preferably an aromatic species. The counter ion preferably has a molecular weight in the range 100 to 500, and more preferably in the range 150 to 200. The counter ion is preferably a sulphonate, a particularly suitable counter ion being para toluene sulphonate anion.

The optional intermediaries $Y_1$, $Y_2$ and $Y_3$ represent one or more atoms providing a linking chain of atom(s) between $R_1$, $R_2$ and $R_3$ and atoms $C_1$, $C_2$ and $C_2$ respectively. The linking chain(s) may be a direct or an indirect link and will normally comprise one or more carbon atoms (which could, for example, include carbon atoms in an aryl ring) and/or hetero atoms (particularly nitrogen and/or oxygen atoms). $Y_1$, $Y_2$ and $Y_3$ are preferably direct links, more preferably an alkylene group, optionally substituted, having up to 10, particularly up to 6 and especially 1 or 2 carbon atoms. In the most preferred embodiment of the invention intermediaries $Y_1$, $Y_2$ and $Y_3$ are absent, ie $R_1$, $R_2$ and $R_3$ are connected directly to atoms $C_1$, $C_2$ and $C_2$ respectively.

$R_1$, $R_2$ and $R_3$ preferably represent hydrogen and/or an alkyl group, optionally substituted, having up to 10, particularly up to 6 and especially 1 or 2 carbon atoms. In the most preferred embodiment of the invention $R_1$, $R_2$ and $R_3$ are all hydrogen. In an alternative embodiment of the invention at least one of $R_1$, $R_2$ and $R_3$ represent an amine, more preferably a tertiary, particularly a secondary and especially a primary amine and/or a salt thereof.

Suitable repeating units are derived during the polymerisation of monoallylamine and/or N-substituted monoallylamines, such as N-2-propenyl-2-propen-1-amine, N-methylallylamine, N-ethylallylamine, N-n-propylallylamine, N-isopropylallylamine, N-n-butylallylamine, N-sec-butylallylamine, N-tert-butylallylamine, N-iso-butylallylamine, N-cyclohexylallylamine and N-benzylallylamine. Monoallylamine is particularly preferred.

The subbing layer polymer comprises up to 100 mole %, preferably greater than 65 mole %, more preferably greater than 75 mole %, particularly greater than 85 mole % and especially greater than 95 mole % of repeating units as herein described. In the most preferred embodiment of the invention the polymer comprises 100 mole % of repeating units as herein described, a particularly suitable subbing layer polymer being polyallylamine and/or a salt thereof.

The subbing layer polymer may be a copolymer, comprising one or more comonomers, in addition to the repeating units as herein described. Suitable additional comonomers may be selected from acrylic acid, methacrylic acid or a derivative of acrylic acid or methacrylic acid, preferably an ester of acrylic acid or methacrylic acid, especially an alkyl ester where the alkyl group contains up to ten carbon atoms such as methyl, ethyl, n-propyl, isopropyl, n-butyl, isobutyl, terbutyl, hexyl, 2-ethyl, hexyl, heptyl, and n-octyl. An alkyl acrylate, eg ethyl acrylate or butyl acrylate, and/or an alkyl methacrylate, eg methyl methacrylate, are particularly preferred comonomers.

Other comonomers which are suitable for use in the preparation of the subbing layer copolymer include acrylonitrile, methacrylonitrile, halo-substituted acrylonitrile, halo-substituted methacrylonitrile, hydroxyethyl methacrylate, glycidyl acrylate, glycidyl methacrylate, itaconic acid, itaconic anhydride and half esters of itaconic acid.

Other optional comonomers include vinyl esters such as vinyl acetate, vinyl chloroacetate and vinyl benzoate; vinyl pyridine; vinyl chloride: vinylidene chloride; maleic acid; maleic anhydride; butadiene; ethylene imine; sulphonated monomers such as vinyl sulphonic acid; styrene and derivatives of styrene such as chloro styrene, hydroxy styrene and alkylated styrenes.

The subbing layer comprises up to 100%, preferably up to 96%, more preferably up to 94%, and particularly up to 92% by weight of the subbing layer polymer as herein described. The subbing layer also preferably comprises greater than 40%, more preferably greater than 50%, particularly greater than 70%, and especially greater than 80% by weight of the subbing layer polymer. By weight of the subbing layer polymer is meant the weight of the free polymer together with the weight of any counter ion associated with the polymer, eg when % is in salt form.

The molecular weight of the subbing layer polymer, not including any counter ion associated therewith, ie the free polymer, can vary over a wide range but the weight average molecular weight is preferably less than 1,000,000, more preferably within the range 5,000 to 200,000, particularly within the range 40,000 to 150,000, and especially within the range 50,000 to 100,000.

The subbing layer may comprise other polymeric materials in addition to the herein described subbing layer polymer, ie the subbing layer may consist of a mixture of the subbing layer polymer and one or more other polymeric resins. The polymeric resin material is preferably an organic resin and may be any film-forming polymeric or oligomeric species or precursor therefor that assists in forming a cohesive coating together with the subbing layer polymer. Suitable polymeric resins include:

(a) "aminoplast" resins which can be prepared by the interaction of an amine or amide with an aldehyde, typically an alkoxylated condensation product of melamine and formaldehyde, eg hexamethoxymethylmelamine, trimethoxy trimethylol melamine formaldehyde;
(b) homopolyesters, such as polyethylene terephthlate
(c) copolyesters, particularly those derived from a sulpho derivative of a dicarboxylic acid such as sulphoterephthalic acid and/or sulphoisophthalic acid;
(d) copolymers of styrene with one or more ethylenically unsaturated comonomers such as maleic anhydride or itaconic acid, especially the copolymers described in GB-A-1540067;
(e) copolymers of acrylic acid and/or methacrylic acid and/or their lower alkyl (up to 6 carbon atoms) esters, eg copolymers of ethyl acrylate and methyl methacrylate, copolymers of methyl methacrylate/-butyl acrylate/acrylic acid typically in the molar proportions 55/27/18% and 36/24/40%;
(f) copolymers of styrene/acrylamide, particularly of the type described in GB-A-1174328 and GB-A-1134876;

(g) functionalised polyolefins, especially maleinised polybutadiene;
(h) cellulosic materials such as nitrocellulose, ethylcellulose and hydroxyethylcellulose;
(i) polyvinyl alcohol; and
(j) polyethylene imine.

In a preferred embodiment of the invention the subbing layer comprises a cross-linking agent, by which is meant a material which reacts chemically during formation of the subbing layer, preferably forming covalent bonds, both with itself and with the surface of the underlying layer to form cross-links thereby improving adhesion thereto. The cross-linking agent is suitably an organic material, preferably a monomeric and/or oligomeric species, and particularly monomeric, prior to formation of the coating layer. The molecular weight of the cross-linking agent is preferably less than 5000, more preferably less than 2000, especially less than 1000, and particularly in the range from 250 to 500. Additionally, the cross-linking agent should preferably be capable of internal cross-linking in order to provide protection against solvent penetration. Suitable cross-linking agents may comprise epoxy resins, alkyd resins, amine derivatives such as hexamethoxymethyl melamine, and/or condensation products of an amine, eg melamine, diazine, urea, cyclic ethylene urea, cyclic propylene urea, thiourea, cyclic ethylene thiourea, aziridines, alkyl melamines, aryl melamines, benzo guanamines, guanamines, alkyl guanamines and aryl guanamines, with an aldehyde, eg formaldehyde. A preferred cross-linking agent is the condensation product of melamine with formaldehyde. The condensation product may optionally be alkoxylated. A catalyst is also preferably employed to facilitate cross-linking action of the cross linking agent. Preferred catalysts for cross-linking melamine formaldehyde include para toluene sulphonic acid, maleic acid stabilised by reaction with a base, and morpholinium paratoluene sulphonate. The subbing layer preferably comprises 0.5% to 70%, more preferably 4% to 50%, particularly 6% to 30%, and especially 8% to 20% by weight of the cross-linking agent.

In a preferred embodiment of the invention the subbing layer contains no gelatin or gelatin-like materials. Indeed, it is one of the surprising aspects of the invention that excellent adhesion to photographic emulsion layers can be achieved by using subbing layers which do not contain gelatin. Relatively small amounts of gelatin may, of course, be added to the subbing layers described herein, without necessarily detracting from the advantages thereof.

The thickness of the subbing layer may vary over a wide range, but is preferably in the range 0.005 $\mu$m to 2.0 $\mu$m, more preferably in the range 0.025 $\mu$m to 0.3 $\mu$m. For films coated on both surfaces, each subbing layer preferably has a coat thickness within the preferred range.

The ratio of substrate to subbing layer thickness may vary within a wide range, although the thickness of the subbing layer should preferably not be less than 0.001% nor greater than 10% of that of the substrate.

The subbing layer polymer is generally water-soluble, although a water-insoluble subbing polymer may be used, for example by applying the subbing layer composition to the polymeric film substrate as an aqueous dispersion or latex.

The subbing layer composition may be applied before, during or after the stretching operation performed in the production of an oriented film. The coating composition may be applied to an already oriented film substrate, such as a biaxially oriented polyester, particularly polyethylene terephthalate film. The subbing layer composition is preferably applied to the film substrate between the two stages (longitudinal and transverse) of a biaxial stretching operation, ie by "inter-draw" coating. Such a sequence of stretching and coating can be suitable for the production of a coated linear polyester film substrate, which is preferably firstly stretched in the longitudinal direction over a series of rotating rollers, coated, and then stretched transversely in a stenter oven, preferably followed by heat setting.

The subbing layer composition may be applied to the polymeric film substrate as an aqueous dispersion or solution in an organic solvent by any suitable conventional coating technique such as dip coating, bead coating, reverse roller coating or slot coating.

If the subbing layer composition is applied to the substrate after the film making process it will generally be necessary to heat the coated film in order to dry the coating layer. The temperature to which the coated film is heated depends, inter alia on the composition of the polymeric substrate. A coated polyester, especially polyethylene terephthalate, substrate is suitably heated from 150° C. to 240° C., preferably from 180° C. to 220° C., in order to dry the aqueous medium, or the solvent in the case of solvent-applied compositions, and also to assist in coalescing and forming the coating into a continuous and uniform layer. In contrast, a coated polyolefin, especially polypropylene, is suitably heated in the range 85° C. to 95° C.

A light-sensitive photographic emulsion layer, eg a conventional X-ray or graphic arts gelatinous silver halide emulsion, may be adhered directly or indirectly to the subbing layer of a coated film according to the invention. Indirect adhesion may be accomplished by interposing a conventional gelatinous subbing layer between the subbing layer described herein and the light-sensitive photographic emulsion layer. In a preferred embodiment of the invention, the light-sensitive photographic emulsion layer is adhered directly to the subbing layer of a coated film according to the invention, ie without an intermediate layer. The light-sensitive emulsion layer may optionally include any of the conventional additives normally used therein.

Prior to deposition of the subbing layer onto the polymeric substrate, or of the light-sensitive photographic emulsion layer onto the subbing layer, the exposed surfaces of the substrate and subbing layer respectively may, if desired, be subjected to a chemical or physical surface-modifying treatment to improve the bond between that surface and the subsequently applied layer. A preferred treatment, because of its simplicity and effectiveness, which is particularly suitable for the treatment of a polyolefin substrate or a subbing layer, is to subject the exposed surface thereof to a high voltage electrical stress accompanied by corona discharge. Corona discharge may be effected in air at atmospheric pressure with conventional equipment using a high frequency, high voltage generator, preferably having a power output of from 1 to 20 kw at a potential of 1 to 100 kv. Discharge is conveniently accomplished by passing the film over a dielectric support roller at the discharge station at a linear speed preferably of 1.0 to 500 m per minute. The discharge electrodes may be positioned 0.1 to 10.0 mm from the moving film surface. An alternative approach, particularly for the substrate, is to pretreat the surface with an agent known in the art to have a solvent or swelling action on the substrate polymer. Examples of such agents, which are particularly suitable for the treatment of a polyester substrate, include a halogenated phenol dissolved in a common organic solvent eg a solution of p-chloro-m-cresol, 2,4-dichlorophenol, 2,4,5- or 2,4 6-trichlorophenol or 4-chlororesorcinol in acetone or methanol.

In a preferred embodiment of the invention the exposed surface of the substrate is not subjected to a chemical or physical surface-modifying treatment, such as corona discharge treatment, prior to deposition of the subbing layer thereon. Another surprising advantage of the invention is that excellent adhesion of the subbing layer to the substrate can be achieved without corona discharge treating the substrate.

One or more of the layers of a coated film according to the invention, ie substrate, subbing or light-sensitive layer(s), may conveniently contain any of the additives conventionally employed in the manufacture of polymeric films. Thus, agents such as dyes, pigments, voiding agents, lubricants, anti-static agents, anti-oxidants, anti-blocking agents, surface active agents, slip aids, gloss-improvers, prodegradants, ultra-violet light stabilisers, viscosity modifiers and dispersion stabilisers may be incorporated in the substrate and/or subbing and/or light-sensitive layer(s), as appropriate. In particular, a substrate may comprise a dye, such as when a blue, grey or black substrate is required, for example for X-ray film. Preferably, a dye, if employed in a substrate layer, should be present in a small amount, generally in the range from 50 ppm to 5,000 ppm, particularly in the range from 500 ppm to 2,000 ppm.

A substrate and/or subbing layer may comprise a particulate filler, such as silica, of small particle size. Desirably, a filler, if employed in a transparent substrate layer, should be present in a small amount, not exceeding 0.5%, preferably less than 0.2%, by weight of the substrate. Preferably a filler, if employed in a subbing layer, should be present in the range 0.05% to 5%, more preferably 0.1 to 1.0% by weight of the subbing layer.

Coated films of the present invention may be used to form various types of composite structures by coating or laminating additional materials onto the subbing layer coated film, in addition to light-sensitive emulsion layers as described herein. For example, the coated films may be laminated with polyethylene or with metal foils such as copper, aluminium and nickel, which can be used to form circuit boards. Vacuum bag lamination, press lamination, roll lamination or other standard lamination techniques can be utilised to form the aforementioned laminates.

Deposition of a metallic layer onto the, or each, subbing layer may be effected by conventional metallising techniques—for example, by deposition from a suspension of finely-divided metallic particles in a suitable liquid vehicle, or, preferably, by a vacuum deposition process in which a metal is evaporated onto the subbing layer surface in a chamber maintained under conditions of high vacuum. Suitable metals include palladium, nickel, copper (and alloys thereof, such as bronze), silver, gold, cobalt and zinc, but aluminium is to be preferred for reasons both of economy and ease of bonding to the resin layer.

Metallising may be effected over the entire exposed surface of the subbing layer or over only selected portions thereof, as desired.

Metallised films may be prepared in a range of thicknesses governed primarily by the ultimate application for which a particular film is to be employed.

A lacquer layer may be applied over the subbing layer to produce a film suitable for use as a drafting film. The lacquer layer preferably comprises one or more polyvinyl alcohol and/or polyvinyl acetal resins. Polyvinyl acetal resins can be suitably prepared by reacting polyvinyl alcohols with aldehydes. Commercially available polyvinyl alcohols are generally prepared by hydrolysing polyvinyl acetate. Polyvinyl alcohols are usually classified as partially hydrolysed (comprising 15 to 30% polyvinyl acetate groups) and completely hydrolysed (comprising 0 to 5% polyvinyl acetate groups). Both types of polyvinyl alcohols, in a range of molecular weights, are used in producing commercially available polyvinyl acetal resins. The conditions of the acetal reaction and the concentration of the particular aldehyde and polyvinyl alcohol used will determine the proportions of hydroxyl groups, acetate groups and acetal groups present in the polyvinyl acetal resin. The hydroxyl, acetate and acetal groups are generally randomly distributed in the molecule. Suitable polyvinyl acetal resins include polyvinyl butyral, and preferably polyvinyl formal.

The lacquer layer preferably additionally comprises finely divided particulate material. When the polymeric film is to be used as a drafting material, the particulate material employed should impart a surface roughness to the film surface which can be marked and will retain the impressions of writing implements such as pencils, crayons and ink.

The finely divided particulate material may be selected from silica, silicates, ground glass, chalk, talc, diamotaceous earth, magnesium carbonate, zinc oxide, zirconia, calcium carbonate and titanium dioxide. Finely divided silica is the preferred material for the production of drafting materials, together with which smaller quantities of the other materials may be incorporated, to obtain the required degree of translucency and to increase the toughness and mark resistance of the coating. Desirably, a filler, if employed in a lacquer layer, should be present in an amount of not exceeding 50% by weight of polymeric material, and the average particle size thereof should not exceed 15 $\mu m$, preferably less than 10 $\mu m$, and especially from 0.1 to 5 $\mu m$.

The subbing layer coated films of the invention may be coated with a range of other organic and/or aqueous solvent based inks and lacquers, for example printing inks, acrylic coatings, cellulose acetate butyrate lacquer, and diazonium coatings for drawing office applications. The coated films may also be used as overhead projecting films, in photoprint applications, in business graphics applications and in electronic imaging applications, such as thermal transfer printing.

The invention is illustrated by reference to the accompanying drawings in which.

Figure 1:
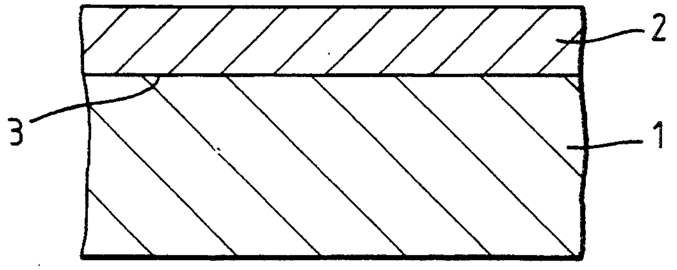
FIG. 1 is a schematic sectional elevation, not to scale, of a coated film having a substrate and subbing layer.

Referring to FIG. 1 of the drawings, the film comprises a polymeric substrate layer (1) having a subbing layer (2) bonded to one surface (3) thereof.

Figure 2:
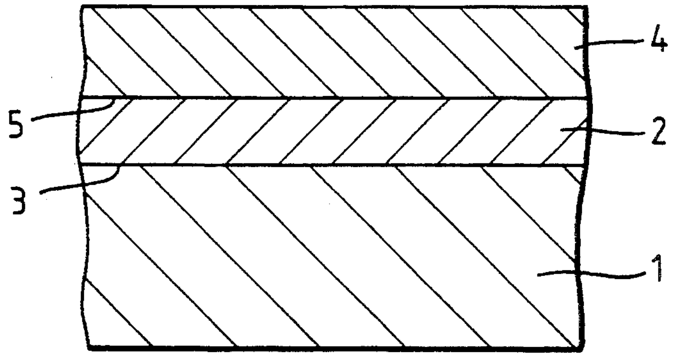
FIG. 2 is a similar schematic elevation of a coated film with an additional light-sensitive layer on top of the subbing layer.

The film of FIG. 2 further comprises an additional light-sensitive layer (4), bonded to one surface (5) of the subbing layer (2).

The invention is further illustrated by reference to the following examples.

The following test procedures were used.

(1) Graphic Arts Gelatin Adhesion Test

A gelatin formulation containing the following ingredients was prepared:

| | |
|---|---|
| Water | 684 ml |
| Photographic grade gelatin | 102 g |
| Methanol | 42.5 ml |
| Congo red dye (35 g in 2 liters of water) | 170 ml |
| Saponin (15 g in 135 ml of water) | 15 ml |
| Potassium hydroxide (45 g in 55 ml of water) | 0.35 ml |

100 g of the gelatin formulation was heated in a water bath at 40° C. and 0.75 ml of formaldehyde solution (50% v/v of approximately 40% w/v formaldehyde soltion in water) was added with stirring. After 30 minutes incubation at 40° C. the gelatin formulation was coated onto a film using a No 7 Meyer Bar. The coated gelatin layer was left to set at room temperature for approximately 4 minutes and transferred to an oven for 30 minutes at 40° C. and 30% relative humidity. The gelatin coated film was removed from the oven and allowed to stabilise at room temperature for 30 minutes. The strength of adhesion of the gelatin layer to the underlying film was determined using a standard cross-hatch adhesive tape test="Dry" test. In order to perform a "Wet" test, the gelatin coated film was immersed in cold water for 5 minutes, a cross-hatch pattern made with a fork in the gelatin layer, which was then rubbed gently with the index finger 6 times. The strength of adhesion for both the "Dry" and "Wet" tests was assessed on a scale of from 1 to 5, wherein 1=excellent adhesion, ie effectively no gelatin was removed, and 5=poor adhesion, ie effectively all the gelatin was removed.

(2) X-Ray Type Photographic Emulsion Adhesion Test

A standard silver chloride X-ray type photographic emulsion was coated onto a film using a No 7 Meyer Bar. The coated film was dried in an oven at 40° C. for 30 minutes and allowed to stabilise at room temperature for 30 minutes. "Dry" and "Wet" adhesion tests were then performed as described above.

EXAMPLE 1

A polyethylene terephthalate film was melt extruded, cast onto a cooled rotating drum and stretched in the direction of extrusion to approximately 3 times its original dimensions. The uniaxially oriented film was coated with a subbing layer composition comprising the following ingredients:

| | |
|---|---|
| PAA-HCL-10S (10% w/w aqueous dispersion of polyallylamine hydrochloride - supplied by Nitto Boseki Co Ltd) | 500 ml |
| Cymel 350 (10% w/w aqueous solution of melamine formaldehyde - supplied by Dyno Cyanamid) | 150 ml |
| Ammonium para toluene sulphonic acid (10% w/w aqueous solution) | 750 ml |
| Synperonic NP10 (10% w/w aqueous solution of nonyl phenol ethoxylate - supplied by ICI) | 70 ml |

-continued

| | |
|---|---|
| Water | to 2.5 liters |

The coated film was passed into a stenter oven, where the film was stretched in the sideways direction to approximately 3 times its original dimensions. The biaxially stretched coated film was heat set at a temperature of about 220° C. by conventional means. The final thickness of the coated film was 100 μm. The thickness of the dried subbing layer was 0.11 μm and the coat weight was 1.1 mgdm$^{-2}$.

The coated film was evaluated in the aforementioned adhesion tests and scored 1 in the "Dry" and "Wet" tests for both graphic arts gelatin and X-ray type photographic emulsion, ie exhibited excellent adhesion.

EXAMPLE 2

This is a comparative Example not according to the invention. The procedure in Example 1 was repeated except that the coating stage was omitted.

The uncoated biaxially oriented polyethylene terephthalate film was evaluated in the aforementioned adhesion tests and scored 5 in the "Dry" and "Wet" tests for both graphic arts gelatin and X-ray type photographic emulsion, ie exhibited poor adhesion.

EXAMPLE 3

The procedure of Example 1 was repeated except that the subbing layer composition was applied, using a No 1 Meyer bar, to a biaxially oriented polyethylene terephthalate film instead of during the film making process. The coated film was dried in an oven for 1 minute at 180° C. The thickness of the dried subbing layer was 0.32 μm and the coat weight was 3.2 mgdm$^{-2}$.

The coated film was evaluated in the aforementioned "Dry" and "Wet" adhesion tests for the graphic arts gelatin and X-ray type photographic emulsion and scored 1 in all cases, ie exhibited excellent adhesion.

EXAMPLE 4

The procedure of Example 3 was repeated except that the subbing layer composition did not contain any ammonium para toluene sulphonic acid. The coated film was evaluated in the aforementioned "Dry" and "Wet" adhesion tests for the graphic arts gelatin and X-ray type photographic emulsion and scored 1 in all cases, ie exhibited excellent adhesion.

EXAMPLE 5

The procedure of Example 3 was repeated except that the subbing layer composition contained grade PAA-HCL-3S (polyallylamine hydrochloride) instead of grade PAA-HCL-10S, and did not contain any Cymel 350. The coated film was evaluated in the aforementioned "Wet" adhesion tests for the graphic arts gelatin and X-ray type photographic emulsion and scored 1 in both cases, ie exhibited excellent adhesion.

EXAMPLE 6

The procedure of Example 1 was repeated except that the polyethylene terephthalate substrate layer contained 18% by weight, based on the weight of the polymer, of a finely divided particulate barium sulphate filler having an average particle size of 0.4 μm.

The coated film was evaluated in the aforementioned adhesion tests and scored 1 in the "Dry" and "Wet"

tests for both graphic arts gelatin and X-ray type photographic emulsion, ie exhibited excellent adhesion.

EXAMPLE 7

This is a comparative Example not according to the invention. The procedure in Example 1 was repeated except that the subbing layer composition comprised the following ingredients:

| | |
|---|---|
| Acrylic resin<br>(46% w/w aqueous latex of<br>methyl methacrylate/ethyl acrylate/methacrylamide<br>46/46/8 mole %) | 30 ml |
| Ammonium nitrate<br>(10% w/w aqueous solution) | 0.15 ml |
| Synperonic N<br>(27% w/w aqueous solution of a nonyl phenol<br>ethoxylate, supplied by ICI) | 5 ml |
| Demineralised water | to 1 liter |

The thickness of the dried subbing layer was 0.025 $\mu$, and the coat weight was 0.3 $mgdm^{-2}$. The coated film was evaluated in the aforementioned "Wet" adhesion tests for the graphic arts gelatin and X-ray type photographic emulsion and scored 5 in all cases, ie exhibited poor adhesion.

The above examples illustrate the improved properties of coated films and light-sensitive photographic films of the present invention.

I claim:

1. A coated film comprising a polymeric film substrate having on at least one surface thereof a subbing layer comprising 0.5% to 70% by weight of a cross-linking agent and greater than 30% by weight of a polymer consisting essentially of repeating units derived during the polymerization of monoallylamine and/or N-substituted monoallylamine, and/or salts thereof, said subbing layer exhibiting improved adhesion to a subsequently applied layer.

2. A coated film according to claim 1 wherein the N-substituted monoallylamine is selected form the group consisting of N-2-propenyl-2-propen-1-amine, N-methylallylamine, N-ethylallylamine, N-n-propylallylamine, N-isopropylallylamine, N-n-butylallylamine, N-sec-butylallylamine, N-tertbutylallylamine, N-isobutylallylamine, N-cyclohexylallylamine and N-benzylallylamine.

3. A coated film according to claim 1 wherein the polymer is polyallylamine and/or a salt thereof.

4. A coated film according to claim 1 wherein the subbing layer is essentially free of gelatin or gelatin-like materials.

5. A coated film according to claim 1 wherein the subbing layer is adhered directly to the surface of the polymeric film substrate.

6. A coated film according to claim 1 wherein the subbing layer is applied to the polymeric film substrate between two stages, namely longitudinal and transverse stretching, of a biaxial stretching operation.

7. A coated film comprising a polymeric film substrate having on at least one surface thereof a subbing layer which comprises 0.5% to 70% by Weight of a cross-linking agent and a polymer consisting essentially of repeating units derived during the polymerization of monoallylamine and/or N-substituted monoallylamine, and/or salts thereof, said subbing layer being essentially free of gelatin or gelatin-like materials and adhering directly to the surface of the polymeric film substrate, said subbing layer exhibiting improved adhesion to a subsequently applied layer.

8. A coated film according to claim 7 including a further layer adhered to said subbing layer.

* * * * *